United States Patent
Yamaguchi et al.

(10) Patent No.: US 9,105,600 B2
(45) Date of Patent: Aug. 11, 2015

(54) SHEET STRUCTURE, METHOD OF MANUFACTURING SHEET STRUCTURE, AND ELECTRONIC DEVICE

(71) Applicant: FUJITSU LIMITED, Kawasaki-shi, Kanagawa (JP)

(72) Inventors: Yoshitaka Yamaguchi, Kawasaki (JP); Seiki Sakuyama, Isehara (JP); Yoshihiro Mizuno, Kobe (JP); Taisuke Iwai, Ebina (JP); Yukie Sakita, Atsugi (JP); Masaaki Norimatsu, Atsugi (JP); Koji Asano, Shinjyuku (JP); Shinichi Hirose, Yokohama (JP); Yohei Yagishita, Isehara (JP)

(73) Assignee: FUJITSU LIMITED, Kawasaki (JP)

( * ) Notice: Subject to any disclaimer, the term of this patent is extended or adjusted under 35 U.S.C. 154(b) by 43 days.

(21) Appl. No.: 13/859,934

(22) Filed: Apr. 10, 2013

(65) Prior Publication Data

US 2013/0307136 A1 Nov. 21, 2013

(30) Foreign Application Priority Data

May 16, 2012 (JP) ................. 2012-112326

(51) Int. Cl.
*H01L 29/24* (2006.01)
*H01L 23/373* (2006.01)
*H01L 23/433* (2006.01)
*B82Y 40/00* (2011.01)

(52) U.S. Cl.
CPC .......... *H01L 23/3733* (2013.01); *H01L 23/373* (2013.01); *H01L 23/433* (2013.01); *B82Y 40/00* (2013.01); *H01L 2224/73253* (2013.01); *Y10S 977/888* (2013.01); *Y10S 977/891* (2013.01); *Y10S 977/932* (2013.01); *Y10T 428/24174* (2015.01)

(58) Field of Classification Search
CPC .......... H01L 2924/01079; H01L 2224/48091; H01L 2924/01078; H01L 2924/01029; H01L 23/4334
USPC .......... 361/704, 705, 708, 709, 710; 257/712; 977/734, 739, 742; 438/106, 122; 428/408, 411.1; 165/96
See application file for complete search history.

(56) References Cited

U.S. PATENT DOCUMENTS

| | | | |
|---|---|---|---|
| 2009/0102046 A1* | 4/2009 | Dimitrakopoulos et al. | 257/712 |
| 2010/0124025 A1* | 5/2010 | Yamaguchi et al. | 361/708 |
| 2010/0219550 A1 | 9/2010 | Yao | |
| 2011/0214264 A1* | 9/2011 | Hsu et al. | 29/25.35 |
| 2012/0236502 A1* | 9/2012 | Yamaguchi et al. | 361/704 |

FOREIGN PATENT DOCUMENTS

| | | |
|---|---|---|
| JP | 2010-118609 A1 | 5/2010 |
| JP | 2010-206203 A1 | 9/2010 |

* cited by examiner

*Primary Examiner* — Steven Loke
*Assistant Examiner* — Didarul Mazumder
(74) *Attorney, Agent, or Firm* — Kratz, Quintos & Hanson, LLP

(57) ABSTRACT

A sheet structure has: a bundle structure including a plurality of linear structures made of carbon which are oriented in a predetermined direction; a covering layer covering the plurality of linear structures made of carbon; and a filling layer provided between the plurality of linear structures made of carbon covered with the covering layer. The thickness of the covering layer is not uniform in a direction crossing the predetermined direction.

5 Claims, 15 Drawing Sheets

MATERIAL GAS

SHEET STRUCTURE, METHOD OF MANUFACTURING SHEET STRUCTURE, AND ELECTRONIC DEVICE

CROSS-REFERENCE TO RELATED APPLICATIONS

This application is based upon and claims the benefit of priority of the prior Japanese Patent Application No. 2012-112326, filed on May 16, 2012, the entire contents of which are incorporated herein by reference.

FIELD

The present invention relates to a sheet structure, a method of manufacturing a sheet structure, and an electronic device.

BACKGROUND

In electronic devices used for a server, a central processing unit of a personal computer, or the like, in order to improve the performance, microfabrication of a semiconductor element has advanced, and the heat generation amount per unit area has increased. As a result, heat dissipation of the electronic device is an important problem. Therefore, a structure in which a heat spreader made of a material having high thermal conductivity such as copper is disposed via a thermal interface material provided on a semiconductor device is being used.

The thermal interface material must have high thermal conductivity and, in addition, must have a characteristic being in contact with the fine irregularities of the surface of a heat generation source and a heat spreader.

A thermal conduction sheet is being sought that uses a linear structure made of carbon represented by a carbon nanotube as the thermal interface material. The carbon nanotube is a material having not only very high thermal conductivity (1500 W/m·K) but also excellent in flexibility and heat resistance, and has high potential as a heat dissipating material.

As a thermal conduction sheet using a carbon nanotube, a thermal conduction sheet in which a filling layer made of a thermoplastic resin is provided among a plurality of linear structures made of carbon represented by a carbon nanotube is being presented.
Japanese Laid-open Patent Publication No. 2010-118609

SUMMARY

FIG. 1 is a diagram depicting an electronic device using a thermal conduction sheet as a thermal interface material.

An electronic device 130 has a semiconductor device 132 disposed over a circuit board 131 via solders 135, a heat spreader 133, and a thermal conduction sheet 110 disposed between the semiconductor device 132 and the heat spreader 133.

The thermal conduction sheet 110 has a bundle structure 112 including a plurality of carbon nanotubes 111 made of carbon oriented in the film thickness direction. The plurality of carbon nanotubes 111 are oriented in the thickness direction of the thermal conduction sheet 110 and conduct heat of the semiconductor device 132 to the heat spreader 133.

In the manufacture of the electronic device 130, first, the semiconductor device 132 is disposed over the circuit board 131 via the solders 135. Next, the thermal conduction sheet 110 is disposed on the semiconductor device 132. The thermal conduction sheet 110 disposed on the semiconductor device 132 is covered with the heat spreader 133.

In the manufacture of the electronic device 130, to solder the semiconductor device 132 over the circuit board 131, for example, a reflow process is used. By being heated in the reflow process, the solders 135 are melted and the circuit board 131 and the semiconductor device 132 are soldered. By the reflow process, the filling layer in the thermal conduction sheet 110 is melted to a liquid state and the thermal conduction sheet 110 is adhered to the semiconductor device 132 and the heat spreader 133. The heat spreader 133 is joined to the circuit board 131 via a joining part 134.

By the heating of the reflow process, the circuit board 131 and the semiconductor device 132 are thermally-expanded. The thermal expansion coefficient of the circuit board 131 formed by synthetic resin is larger than that of the semiconductor device 132.

Consequently, in the cooled electronic device 130, the semiconductor device 132 is deformed in a curved shape which is projected upward. The part in the circuit board 131 joined to the semiconductor device 132 via the solders 135 is similarly deformed in the curved shape which is projected upward.

When the semiconductor device 132 is deformed due to the difference between the thermal expansion coefficient of the circuit board 131 and that of the semiconductor device 132, the thermal conduction sheet 110 disposed between the semiconductor device 132 and the heat spreader 133 is compressed in the thickness direction. Since the semiconductor device 132 is deformed so as to be projected upward, the center part of the thermal conduction sheet 110 is largely deformed so as to be compressed in the film thickness direction more than the peripheral part.

The thermal resistance between the carbon nanotubes 111 and the semiconductor device 132 or the heat spreader 133 decreases as the contact pressure increases. In the center part of the thermal conduction sheet 110, the contact pressure between the carbon nanotubes 111 and the semiconductor device 132 or the heat spreader 133 is higher than that in the peripheral part. Therefore, in the center part of the thermal conduction sheet 110, the thermal resistance between the carbon nanotubes 111 and the semiconductor device 132 or the heat spreader 133 is lower than that in the peripheral part.

The deformation of the semiconductor device 132 therefore causes a problem that the thermal conduction in the plane of the thermal conduction sheet 110 becomes non-uniform.

According to an aspect of the embodiment of a sheet structure disclosed in the specification, the sheet structure includes: a bundle structure including a plurality of linear structures made of carbon which are oriented in a predetermined direction; a covering layer covering the plurality of linear structures made of carbon; a filling layer provided between the plurality of linear structures made of carbon covered with the covering layer. Thickness of the covering layer is not uniform in a direction crossing the predetermined direction.

According to an aspect of the embodiment of an electronic device disclosed in the specification, the electronic device includes: a heat generating member; a heat dissipating member; and a sheet structure including a bundle structure including a plurality of linear structures made of carbon which are oriented in a predetermined direction, a covering layer covering the plurality of linear structures made of carbon, and a filling layer provided between the plurality of linear structures made of carbon covered with the covering layer, thickness of the covering layer being not uniform in a direction crossing the predetermined direction, and the sheet structure being disposed between the heat generating member and the heat dissipating member.

According to an aspect of the embodiment of a method of manufacturing a sheet structure disclosed in the specification, the method includes: forming, on a substrate, a plurality of linear structures made of carbon which are oriented in a predetermined direction; forming a covering layer covering the plurality of linear structures made of carbon so that thickness of the covering layer is not uniform in a direction crossing the predetermined direction; forming a filling layer in gaps among the plurality of linear structures made of carbon covered with the covering layer; and peeling off the plurality of linear structures made of carbon from the substrate.

The object and advantages of the embodiments will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Hereinafter, preferred embodiments of an electronic device disclosed in the specification will be described with reference to the drawings. The technical scope of the present invention is not limited to the embodiments but includes the invention described in the scope of claims and its equivalents.

Figure 1:
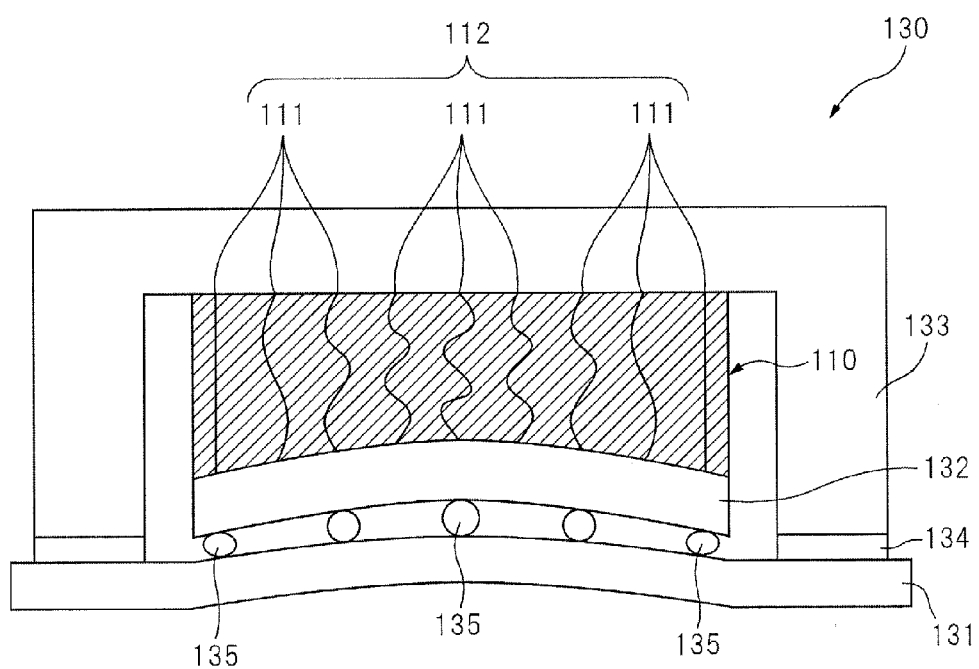
FIG. 1 is a diagram depicting a conventional electronic device.
Figure 2:
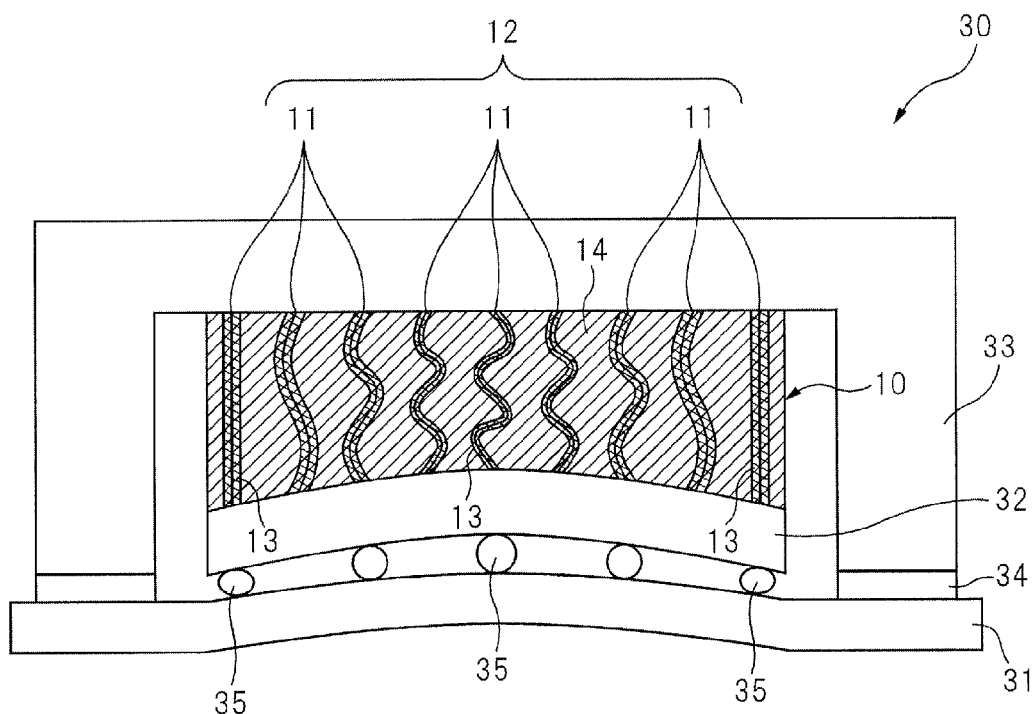
FIG. 2 is a diagram depicting an embodiment of an electronic device disclosed in the specification.

FIG. 2 is a diagram depicting an embodiment of an electronic device disclosed in the specification.

An electronic device 30 of the embodiment has a circuit board 31 and a semiconductor device 32 disposed over a circuit board 31. The semiconductor device 32 is electrically connected to the circuit board 31 via bump-shaped solders 35.

On the semiconductor device 32 as a heat generating member, a heat spreader 33 as a heat dissipating member for diffusing heat from the semiconductor device 32 is disposed so as to cover the semiconductor device 32. Between the semiconductor device 32 and the heat spreader 33, a carbon nanotube sheet 10 is disposed. The heat spreader 33 is joined to the circuit board 31 by a joining part 34 formed by an organic sealant or the like.

As described above, in the electronic device 30, a carbon nanotube sheet 10 is disposed between the semiconductor device 32 and the heat spreader 33, i.e., between a heat generating member and a heat dissipation member. The carbon nanotube sheet 10 is a heat conduction sheet functioning as a thermal interface material between the semiconductor device 32 and the heat spreader 33.

The carbon nanotube sheet 10 has a bundle structure 12 including a plurality of carbon nanotubes 11 made of carbon disposed in the film thickness direction and a covering layer 13 covering the carbon nanotubes 11 in the longitudinal direction.

The carbon nanotube sheet 10 includes a filling layer 14 provided between the plurality of carbon nanotubes 11 covered with the covering layer 13. The gaps among the plurality of carbon nanotubes 11 covered with the covering layer 13 are filled with the filling layer 14 to maintain the sheet shape.

By heating and cooling in the manufacture of the electronic device 30, due to the difference in the thermal expansion coefficient between the semiconductor device 32 and the circuit board 31, the semiconductor device 32 is deformed in a shape which is projected upward toward the heat spreader 33. The part in the circuit board 31 joined to the semiconductor device 32 via the solders 35 is similarly deformed so as to be projected upward.

When the semiconductor device 32 is deformed as described above, the carbon nanotube sheet 10 disposed between the semiconductor device 32 and the heat spreader 33 is compressed in the film thickness direction. Since the semiconductor device 32 is deformed so as to be projected toward the heat spreader 33, the center part of the carbon nanotube sheet 10 is largely deformed so as to be compressed in the film thickness direction more than the peripheral part. Consequently, the thickness in the center part of the carbon nanotube sheet 10 having predetermined thickness in the beginning becomes smaller than in the peripheral part.

The deformed carbon nanotube sheet 10 has elasticity in reaction to the deformation applied in the film thickness direction, and stress occurs in reaction to the deformation in the film thickness direction.

In the carbon nanotube sheet 10, the thickness of the covering layer 13 covering the carbon nanotubes 11 is not uniform in the direction orthogonal to the film thickness direction, and the elastic modulus in the film thickness direction of the carbon nanotube 11 covered with the covering layer 13 varies in the direction orthogonal to the film thickness direction. Hereinafter, the direction orthogonal to the film thickness direction of the carbon nanotube sheet 10 will be also referred to as a plane direction.

The thickness of the covering layer 13 in a portion where the carbon nanotube sheet 10 is thick is larger than that of the covering layer 13 in a portion where the carbon nanotube sheet 10 is thin.

That is, the thickness of the covering layer 13 in the peripheral part of the carbon nanotube sheet 10 is larger than that in the covering layer 13 in the center part. Consequently, the elastic modulus in the film thickness direction in the peripheral part of the carbon nanotube sheet 10 is higher than that in the center part.

Preferably, the thickness of the covering layer 13 in the plane direction of the carbon nanotube sheet 10 is set so that the stress in the film thickness direction in the plane of the deformed carbon nanotube sheet 10 becomes constant. The setting of the thickness of the covering layer 13 will be described later.

Therefore, in the carbon nanotube sheet 10, the contact pressure between the carbon nanotube 11 and the semiconductor device 32 or the heat spreader 33 in the center part and that in the peripheral part are almost the same. Consequently, the thermal resistance between the carbon nanotube 11 and the semiconductor device 32 or the heat spreader 33 becomes almost constant in the plane direction of the deformed carbon nanotube sheet 10 and, accordingly, the thermal conduction is constant.

In the carbon nanotube sheet 10, since the carbon nanotubes 11 are oriented in the film thickness direction, the thermal conductivity in the film thickness direction is high. Since the carbon nanotube 11 is provided with the covering layer 13, by giving elasticity in the film thickness direction to the carbon nanotube 11, mechanical strength can be increased. Consequently, mechanical strength of the bundle structure 12 of the carbon nanotube 11 can be increased, so that load tolerance of the carbon nanotube sheet 10 can be improved.

The expression that the carbon nanotubes 11 are oriented in the thickness direction of the sheet means that the extension direction of the carbon nanotubes 11 coincides with the film thickness direction. For example, there is a case that the carbon nanotubes 11 positioned in the center part of the deformed carbon nanotube sheet 10 are compressed and deformed in the film thickness direction, in which case, the deformed carbon nanotubes 11 still extend in the film thickness direction. Therefore, in the embodiment, the orientation direction of the carbon nanotubes 11 coincides with the film thickness direction of the carbon nanotube sheet 10.

The carbon nanotube sheet 10 will now be described more specifically.

Figure 3:
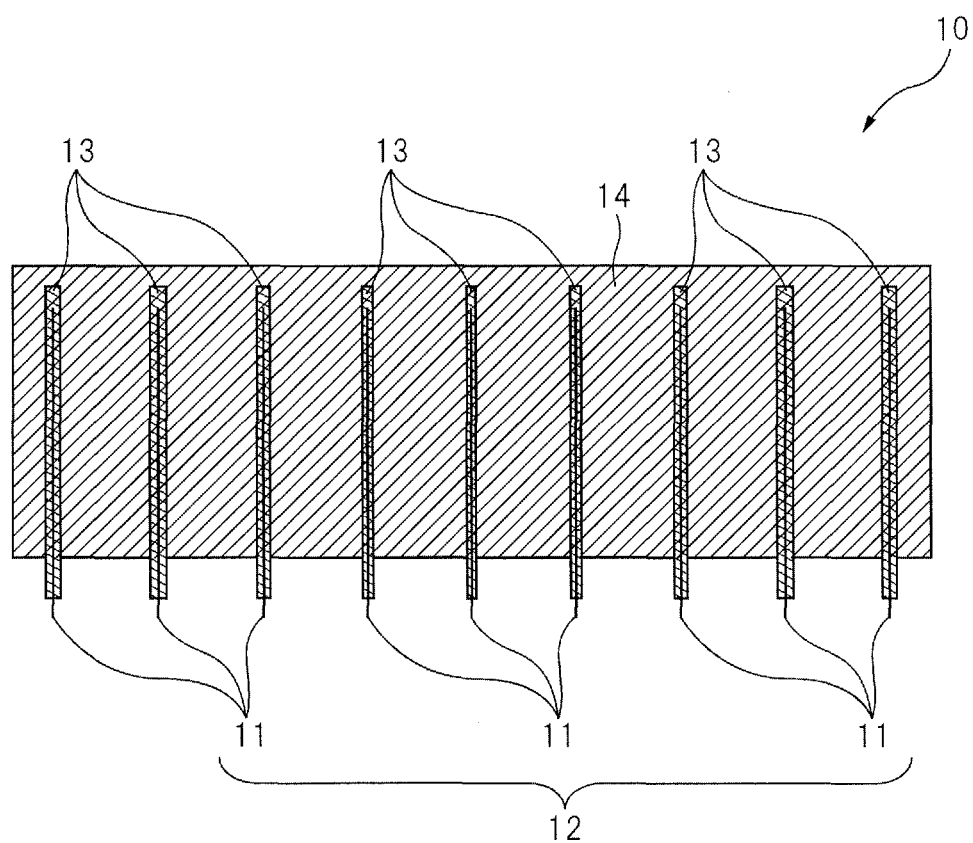
FIG. 3 is a diagram depicting an embodiment of a carbon nanotube sheet disclosed in the specification.

FIG. 3 is a diagram depicting an embodiment of a carbon nanotube sheet disclosed in the specification.

The carbon nanotube 10 depicted in FIG. 3 is in a state before it is installed in an electronic device. The carbon nanotube 10 is not deformed but is flat and has constant thickness. The shape of the carbon nanotube sheet 10 in plan view is, preferably, is the same as or slightly larger than the semiconductor device 32.

As depicted in FIG. 3, the carbon nanotube sheet 10 has a plurality of carbon nanotubes 11 disposed at intervals. The carbon nanotube 11 is a linear structure made of carbon. The carbon nanotube 11 may be either a single-layer carbon nanotube or a multilayer carbon nanotube.

In the carbon nanotube sheet 10, the plurality of carbon nanotubes 11 are oriented in the thickness direction of the sheet, that is, the direction crossing the plane of the sheet. Preferably, the surface density of the carbon nanotube 11 is, although not limited, $1 \times 10^{10}$ pieces/cm$^2$ or higher from the viewpoint of heat dissipation and electric conductivity. The plurality of carbon nanotubes 11 are formed in closely provided tubes to form the bundle structure 12. The diameter (average value) of the carbon nanotube 11 is, although not limited, for example, 25 nm.

The length of the carbon nanotube 11 is determined according to the usage of the carbon nanotube sheet 10 and can be preferably set to the value of about 5 μm to 500 μm. In the case of using the carbon nanotube sheet 10 as a thermal interface material formed between a heat generating member (for example, the semiconductor device) and a heat dissipating member (for example, the heat spreader), at least, the length is desirably at least a length in which the uneven surface of the heat generating member and the heat dissipating member is buried.

As depicted in FIG. 3, the carbon nanotube 11 is provided with the covering layer 13 covering the carbon nanotube 11 in the longitudinal direction. Preferably, the covering layer 13 is formed so as to cover the surface extending from one end to the other end in the longitudinal direction of the carbon nanotube 11.

The covering layer 13 has a function of enhancing the mechanical strength of the carbon nanotube 11 and, accordingly, has a function of increasing the mechanical strength of the bundle structure 12 of the carbon nanotube 11. In this regard, more preferably, the covering layer 13 is formed so as to cover continuously the entire surface extending from one end to the other of the carbon nanotube 11. The covering layer 13 may not cover a part of the surface of the carbon nanotube 11 as long as it has the function of increasing the mechanical strength.

The covering layer 13 may be formed as a thin film on the carbon nanotube 11 or may be formed so as to cover the surface of the carbon nanotube 11 as an ensemble of particles. The shape of the covering layer 13 is not limited as long as the covering layer 13 has the function of increasing the mechanical strength.

Preferably, by providing the carbon nanotube 11 with the covering layer 13, the carbon nanotube sheet 10 has elasticity in reaction to deformation given in the film thickness direction.

The end(s) of the carbon nanotube 11 may be covered with the covering layer 13. Although FIG. 3 depicts the structure that only one of the ends of the carbon nanotube 11 is covered with the covering layer 13, both ends may be covered with the covering layer 13.

In the case of using the carbon nanotube sheet 10 in which the ends of the carbon nanotubes 11 are covered with the covering layer 13 as a thermal interface material formed between the heat generating member and the heat dissipating member, the covering layer 13 formed at the end of the carbon nanotube 11 is interposed between the heat generating member or the heat dissipating member and the carbon nanotube 11.

Consequently, the material of the covering layer 13 is, preferably, although not limited, a material whose thermal conductivity is higher than the thermal conductivity (about 0.1 W/m·K) of a thermoplastic resin which will be described later. The reason is that, if the thermal conductivity of the covering layer 13 is lower than that of the thermoplastic resin, there is the case that thermal resistance between the heat generating member and the heat dissipating member becomes higher than that in the case where the thermoplastic resin remains between the carbon nanotube and the heat generating member and the heat dissipating member.

Further, the material of the covering layer 13 is desirably a material having thermal conductivity higher than that per unit area of the bundle structure 12 of the carbon nanotubes 11. In this case, even if the covering layer 13 is interposed between the heat generating member or the heat dissipating member and the carbon nanotube, it does not deteriorate the high thermal conductivity of the carbon nanotube 11. By the covering layer 13 formed in the carbon nanotube 11, an additional thermal conductive path is formed between the heat generating member and the heat dissipating member. When the thermal conductivity per carbon nanotube is 1,500 W/m·K, the diameter of the carbon nanotube is 20 nm, and the surface density of the carbon nanotube is $1 \times 10^{10}/cm^2$, the thermal conductivity per unit area of the bundle structure 12 of the carbon nanotube 11 is about 47.1 W/m·K.

As the material of the covering layer 13, although not limited, for example, an oxidized metal such as aluminum oxide ($Al_2O_3$) or zinc oxide (ZnO) can be used. Alternatively, a metal such as copper (Cu), ruthenium (Ru), or platinum (Pt) can be used.

Preferably, the thickness (average value) of the covering layer 13 is, for example, 100 nm or less. When the thickness of the covering layer 13 is increased excessively, the flexibility the carbon nanotube 11 originally has deteriorates, it becomes difficult for the plurality of carbon nanotubes 11 to be bent so as to follow the uneven shape of the surface of the heat generating member and the heat dissipating member, and the number of carbon nanotubes which are coupled to the heat generating member and the heat dissipating member without a filling layer 14 decreases. Since the mechanical strength that the bundle structure 12 of the carbon nanotube 11 originally has varies according to the surface density of the carbon nanotube 11, the permissible thickness of the covering layer 13 also depends on the surface density of the carbon nanotube 11. However, from the viewpoint of the heat dissipation and electric conductivity, since a predetermined lower limit value exists in the surface density itself of the carbon nanotube 11, the permissible thickness of the covering layer 13 also has the upper limit value as described above.

The filling layer 14 is formed in the gaps among the carbon nanotubes 11 in which the covering layer 13 is formed, and the carbon nanotubes 11 are supported by the filling layer 14. The filling layer 14 is, although not limited, for example, a thermoplastic resin.

The state of the thermoplastic resin as the material of the filling layer 14 changes reversibly between a liquid and a solid in accordance with temperature. The thermoplastic resin is not limited as long as it is a solid at room temperature, changes to a liquid state when heated, and returns to a solid while expressing adhesiveness when cooled. The thermoplastic resin as the material of the filling layer 14 may be properly selected on the basis of the melting temperature of the thermoplastic resin in accordance with the purpose of using the carbon nanotube sheet 10. As such a thermoplastic resin, for example, a hot-melt resin can be used.

Figure 4:
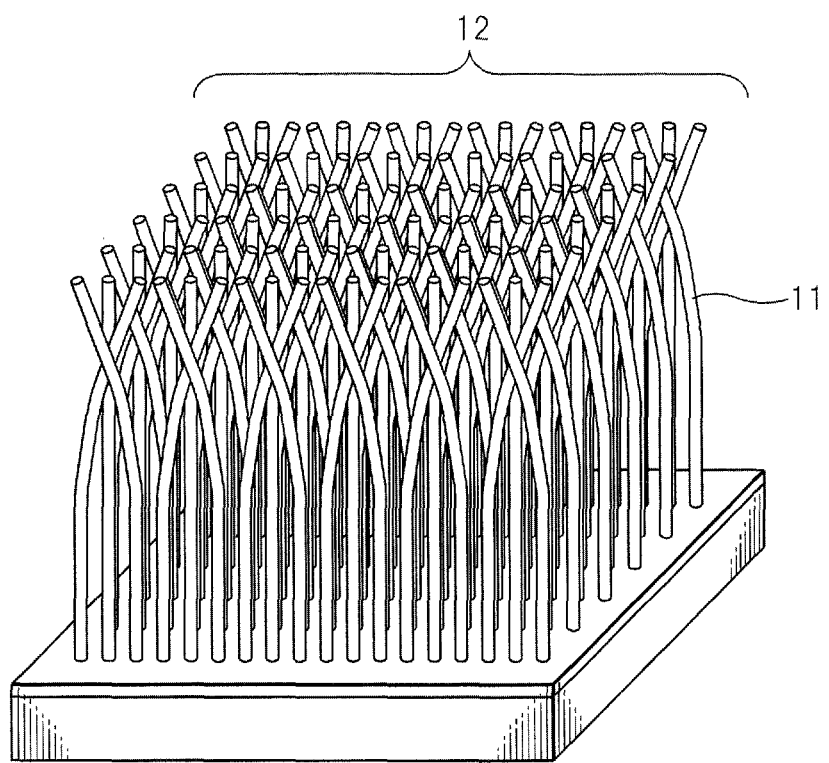
FIG. 4 is a diagram depicting a state where a plurality of carbon nanotubes are entangled with one another in the carbon nanotube sheet.

Although not depicted in FIG. 3 for simplification, in the actual bundle structure 12 of the carbon nanotubes 11, as depicted in FIG. 4, at least a part of a plurality of carbon nanotubes are formed so as to be entangled with each other. Consequently, in the actual bundle structure 12 of the carbon nanotubes 11, the neighboring carbon nanotubes 11 support one another.

Figure 5:
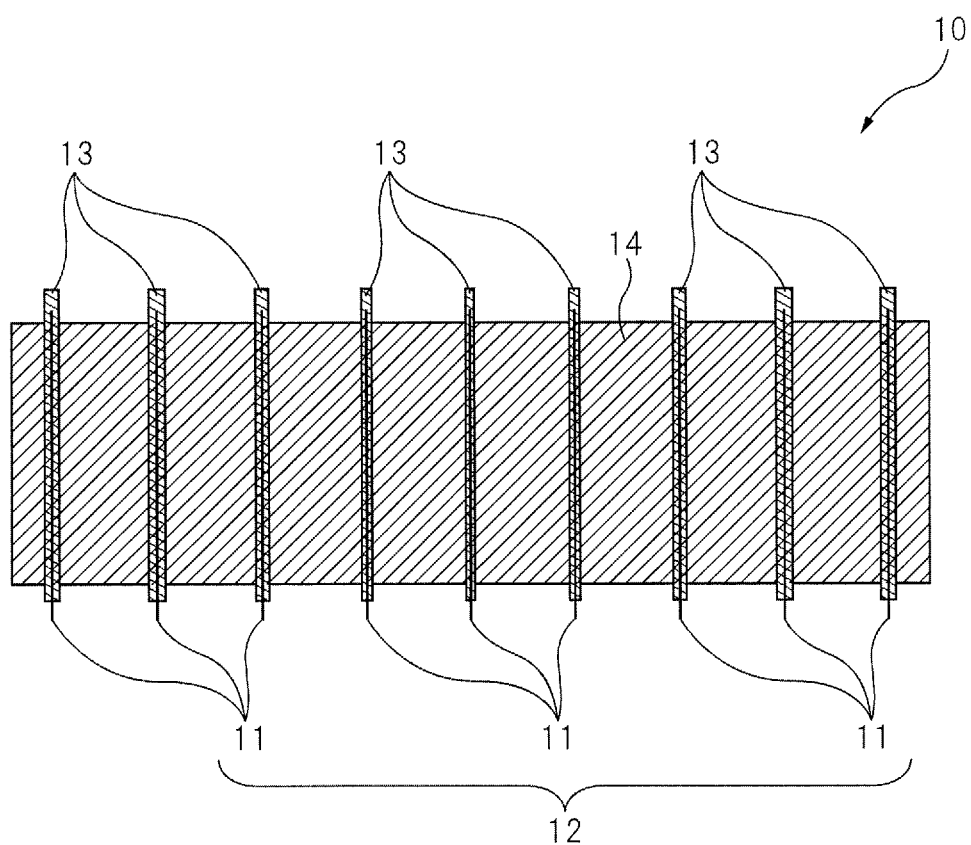
FIG. 5 is a diagram depicting another embodiment of a carbon nanotube sheet disclosed in the specification.

In the carbon nanotube sheet 10, as depicted in FIG. 5, both ends of the carbon nanotubes 11 may be exposed from the filling layer 14.

With the configuration, when the carbon nanotube sheet 10 comes into contact with the heat generating member or the heat dissipating member, the carbon nanotubes 11 are coupled to the heat dissipating member or the heat generating member without the filling layer 14, so that thermal conductivity can be largely increased. Since the carbon nanotube 11 also has electric conductivity, by exposing both ends of the carbon nanotube 11, the carbon nanotubes 11 can be used as wiring bodies penetrating the sheet. That is, the carbon nanotube sheet 10 of the embodiment can be used not only as the thermal conduction sheet but also as a vertical wiring sheet.

Next, the setting of the thickness of the covering layer 13 will be described using the following concrete example.

Figure 6:
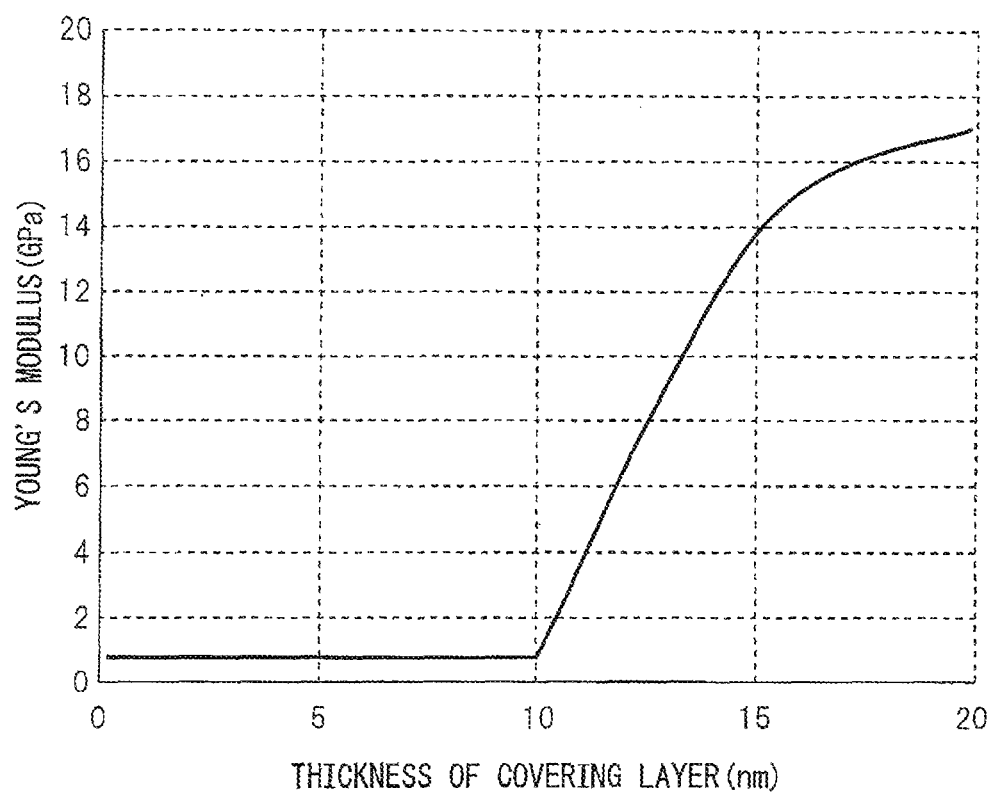
FIG. 6 is a diagram depicting the relation between Young's modulus of the carbon nanotube sheet and thickness of a covering layer.

FIG. 6 is a diagram depicting the relation between Young's modulus of the carbon nanotube sheet and thickness of the covering layer.

FIG. 6 depicts a result of examining the relation between the Young's modulus in the film thickness direction of the carbon nanotube sheet formed so that the thickness of the covering layer in the plane direction of the sheet is constant and the thickness of the covering layer. The length of the carbon nanotube was 60 µm, and aluminum oxide was used as the material of the covering layer. Using atomic layer deposition (ALD), the covering layer was formed. Hereinafter, the carbon nanotube sheet may be also called a CNT sheet.

The carbon nanotube sheet used to generate the graph was elastic deformed and did not show elasticity when the thickness of the covering layer was less than 10 nm. Therefore, to give elasticity in the thickness direction of the carbon nanotube sheet, the thickness of the covering layer has to be set to 10 nm or larger.

First, the deformation amount of the semiconductor device as the heat generating member is obtained. The deformation amount of the semiconductor device can be obtained, for example, by examining the shape of the semiconductor device deformed in the manufactured electronic device.

Next, the deformation amount of the carbon nanotube sheet caused by upward bending of the semiconductor device toward the heat spreader is obtained. Since the initial thickness of the carbon nanotube sheet is constant and the interval between the semiconductor device and the heat spreader is constant, the carbon nanotube sheet is deformed so that the thickness decreases only by the amount of upward deformation of the semiconductor device.

It is assumed that, from examining the shape of the semiconductor device, the deformation amount in the center part of the carbon nanotube sheet is 50 μm and the deformation amount in the peripheral part is 10 μm.

It is also assumed that the thickness of the covering layer in the center part of the carbon nanotube sheet is 10 nm. When the relation of FIG. 6 is used, the Young's modulus in the center part of the carbon nanotube sheet 10 is 0.7 GPa. The thickness of the covering layer in the center part of the carbon nanotube sheet is not limited.

In the center part of the carbon nanotube sheet 10, the deformation amount in the thickness direction is 50 μm and the Young's modulus is 0.7 GPa, so that the stress in the thickness direction of the center part is 35 GPaμm.

To obtain the same stress (35 GPaμm) in the thickness direction also in the peripheral part of the carbon nanotube sheet 10 as that in the center part, using the fact that the deformation amount in the thickness direction of the peripheral part is 10 μm, it is sufficient to set the Young's modulus to 3.5 Gpa.

It is understood from the relation of FIG. 6 that the Young's modulus of 3.5 Gpa is obtained by setting the thickness of the covering layer 13 to 12 nm.

In such a manner, the thickness of the covering layer 13 in the center part and that in the peripheral part in the carbon nanotube sheet 10 are set. The thickness of the covering layer 13 in the other part in the carbon nanotube sheet 10 can be similarly set on the basis of the deformation amount of the semiconductor device.

Figure 7A:
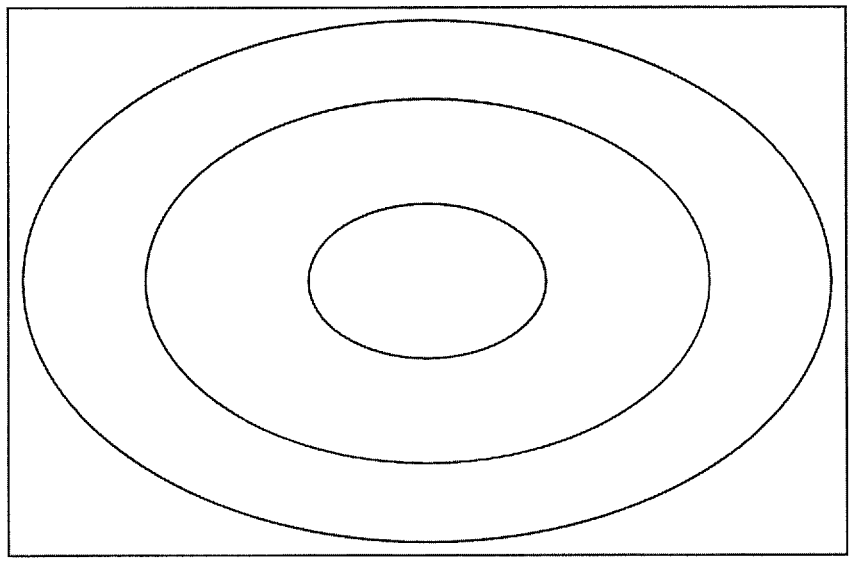
FIG. 7A is a diagram for illustrating the distribution of thickness of the covering layer in the carbon nanotube sheet.

FIG. 7A is a diagram depicting an example of the distribution of thickness of the covering layer 13 in the case where the shape of the carbon nanotube sheet 10 in plan view is rectangle. The line of an oval shape in FIG. 7A is obtained by connecting parts having the same thickness in the covering layer 13. In the case where the shape of the semiconductor device is rectangle, the shape of the carbon nanotube sheet 10 is the same rectangle shape. FIG. 7A depicts an example of the distribution of thickness of the covering layer 13.

Figure 7B:
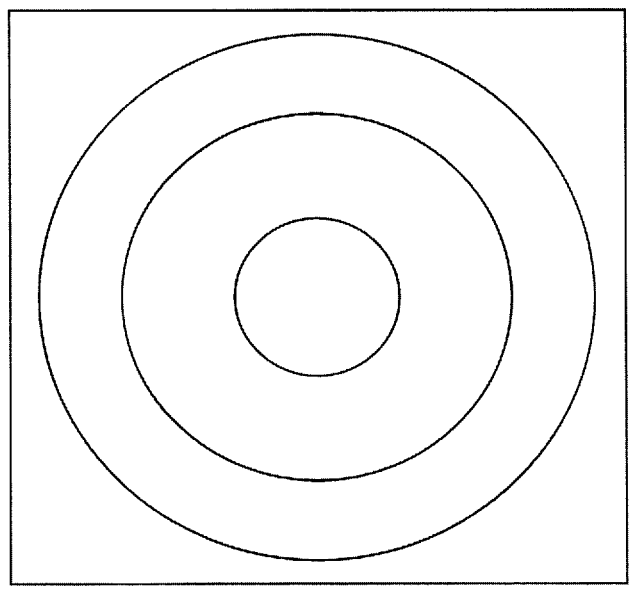
FIG. 7B is a diagram for illustrating the distribution of thickness of the covering layer in the carbon nanotube sheet.

FIG. 7B is a diagram depicting an example of the distribution of thickness of the covering layer 13 in the case where the shape of the carbon nanotube sheet 10 in plan view is square. The line of a circle in FIG. 7B is obtained by connecting parts having the same thickness in the covering layer 13. In the case where the shape of the semiconductor device is square, the shape of the carbon nanotube sheet 10 is the same square shape. FIG. 7B depicts an example of the distribution of thickness of the covering layer 13.

The relation between the Young's modulus and the thickness of the covering layer depicted in FIG. 6 is an example used to illustrate the way of thinking of setting the thickness of the covering layer 13. The Young's modulus of the carbon nanotube changes according to a condition such as length, density, or diameter of the carbon nanotube even when the same material of the covering layer is used. The relation between the Young's modulus and the thickness of the covering layer depicted in FIG. 6 changes according to the material of the covering layer even when the same carbon nanotube is used.

Hereinafter, a preferred first embodiment of a method of manufacturing the carbon nanotube sheet 10 will be described with reference to FIGS. 8 to 15.

Figure 8:
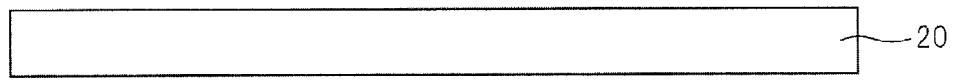
FIG. 8 is a diagram depicting a process (No. 1) of a first embodiment of a method of manufacturing a carbon nanotube sheet disclosed in the specification.

First, as depicted in FIG. 8, a substrate 20 as a base for forming the carbon nanotube sheet 10 is prepared. As the substrate 20, a semiconductor substrate such as a silicon substrate, an insulating substrate such as an alumina (sapphire) substrate, an MgO substrate, or a glass substrate, a metal substrate, or the like can be used. Any of the substrates on which a thin film is formed may be also used. For example, a silicon substrate on which a silicon oxide film having a thickness of about 300 nm is formed can be used.

The substrate 20 is peeled off after growth of the carbon nanotubes 11. Consequently, the substrate 20 is desired not to be transformed by growth temperature of the carbon nanotube 11. Preferably, at least the surface coupled to the carbon nanotube 11 is made of a material which can be easily peeled off from the carbon nanotube 11.

Figure 9:
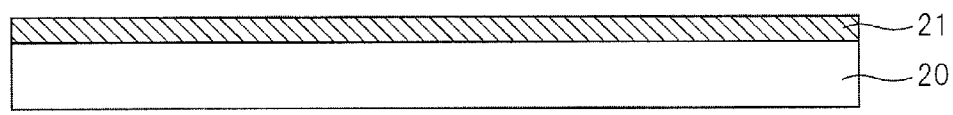
FIG. 9 is a diagram depicting a process (No. 2) of the first embodiment of the method of manufacturing the carbon nanotube sheet disclosed in the specification.

As depicted in FIG. 9, on the substrate 20, an Fe (iron) film having a thickness of 2.5 nm is formed by, for example, sputtering to form an Fe catalyst layer 21. The catalyst layer 21 does not always have to be formed on the entire surface of the substrate 20 but may be selectively formed on a predetermined region of the substrate 20 by using, for example, the lift-off method.

As the catalyst metal, other than Fe, Co (cobalt), Ni (nickel), Au (gold), Ag (silver), Pt (platinum), or an alloy containing at least one of the materials may be used. As the catalyst, other than a metal film, metal particles fabricated by controlling the size in advance using a differential mobility analyzer (DMA) or the like may be used. In this case as well, metallic species may be similar to those in the case of a thin film.

As a foundation layer of the catalyst metal, a film made of Mo (molybdenum), Ti (titanium), Hf (hafnium), Zr (zirconium), Nb (niobium), V (vanadium), TaN (tantalum nitride), TiSix (titanium silicide), Al (Aluminum), Al$_2$O$_3$ (aluminum oxide), TiOx (titanium oxide), Ta (tantalum), W (tungsten), Cu (copper), Au (gold), Pt (platinum), Pd (palladium), TiN (titanium nitride), or the like or a film made of an alloy containing at least one of the materials may be formed.

Next, on the substrate 20, for example, by hot-filament CVD, the carbon nanotube 11 is grown using the catalyst layer 21 as a catalyst. As growth conditions of the carbon nanotube 11, for example, mixture gas of acetylene and argon (partial pressure ratio 1:9) is used as the material gas, total gas pressure in a film forming chamber is 1 kPa, hot filament temperature is 1,000° C., and growth time is 25 minutes. Under the growth conditions, a multilayer carbon nanotube having an average number of layers of about five, an average diameter of 25 nm, and a length of 50 μm (growth rate: 2 μm/min) can be grown.

The carbon nanotube may be formed by another film forming method such as thermal CVD or remote plasma CVD. The carbon nanotube to be grown may be a single-layer carbon nanotube. As the carbon material, other than acetylene, hydrocarbons such as methane and ethylene, alcohols such as ethanol and methanol, and the like may be used.

Figure 10:
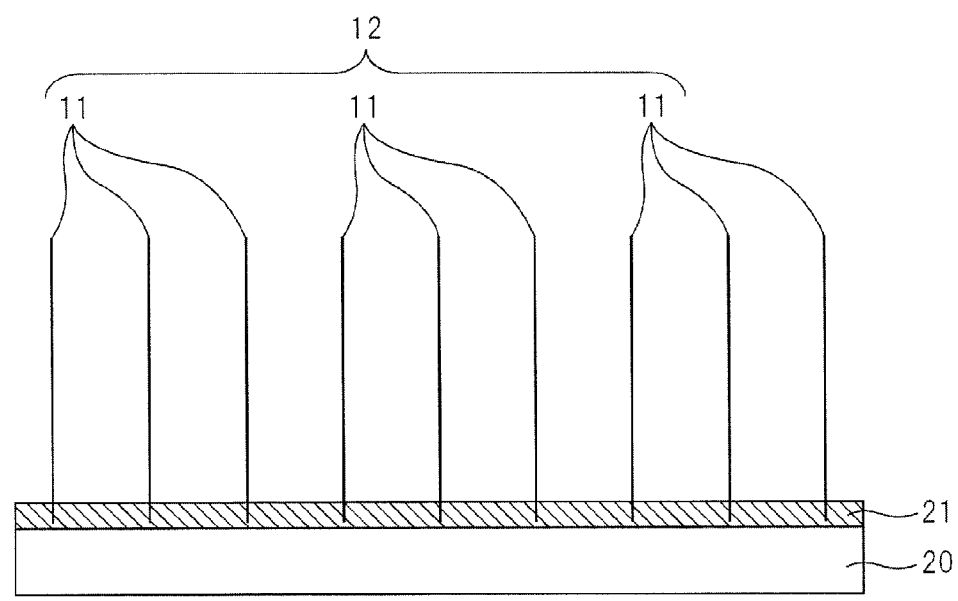
FIG. 10 is a diagram depicting a process (No. 3) of the first embodiment of the method of manufacturing the carbon nanotube sheet disclosed in the specification.

By the above-described processes, as depicted in FIG. 10, the bundle structure 12 including a plurality of carbon nanotubes 11 oriented in the normal direction of the substrate 20 (vertical orientation) is formed on the substrate 20. Although not depicted in FIG. 10 for simplification, the bundle structure 12 of the actual carbon nanotubes 11 is formed so that the plurality of carbon nanotubes 11 are entangled with one another as depicted in FIG. 4.

In the carbon nanotube 11 formed under the above-described growth conditions, the surface density of the carbon nanotubes 11 is about $1 \times 10^{11}$ pieces/cm$^2$. It corresponds to the state that the carbon nanotubes 11 are formed in an area of about 10% of the surface area of the substrate 20.

Figure 11:
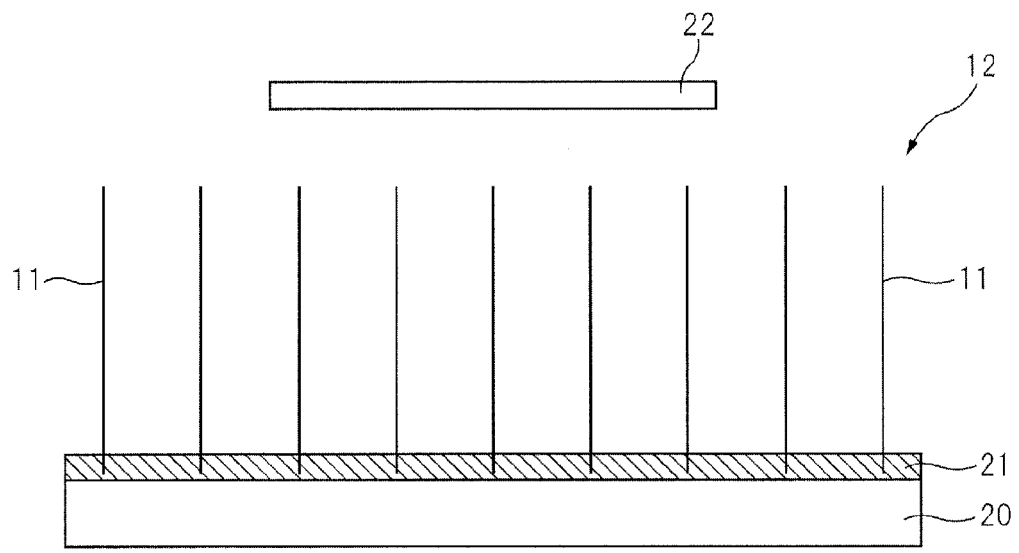
FIG. 11 is a diagram depicting a process (No. 4) of the first embodiment of the method of manufacturing the carbon nanotube sheet disclosed in the specification.

As depicted in FIG. 11, a shield plate 22 is disposed so as to cover a part of the plurality of carbon nanotubes 11. In the embodiment, the shield plate 22 is disposed above the center part of the substrate 20. The shield plate 22 has the function of blocking direct supply of the material gas forming the covering layer 13 to the carbon nanotubes 11.

Figure 12:
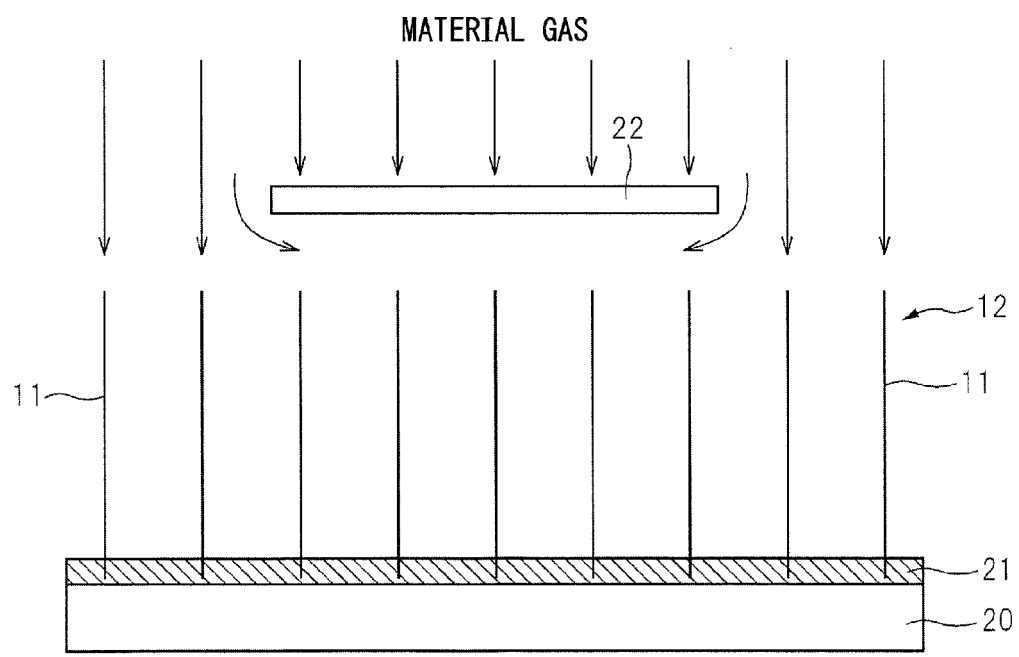
FIG. 12 is a diagram depicting a process (No. 5) of the first embodiment of the method of manufacturing the carbon nanotube sheet disclosed in the specification.

Next, as depicted in FIG. 12, the covering layer 13 is formed on the carbon nanotubes 11 by using atomic layer deposition (ALD). The material gas forming the covering layer 13 is passed from above the substrate 20 toward the substrate 20. The material gas is directly supplied to the carbon nanotubes 11 which are not covered with the shield plate 22. However, the material gas is not directly supplied to the carbon nanotubes 11 covered with the shield plate 22. To the carbon nanotubes 11 covered with the shield plate 22, the material gas is supplied so as to be diffused from ends of the shield plate 22 toward the inside.

Therefore, the supply amount of the material gas to the carbon nanotubes 11 covered with the shield plate 22 is smaller than that to the carbon nanotubes 11 which are not covered with the shield plate 22.

Also in the part of the carbon nanotubes 11 covered with the shield plate 22, the material gas supply amount varies according to the positions of the carbon nanotubes 11. The amount of the material gas supplied to the carbon nanotubes 11 positioned below the center of the shield plate 22 is smaller than that to the carbon nanotubes 11 positioned below the ends of the shield plate 22. In the embodiment, from the viewpoint of giving elasticity in the thickness direction, the covering layer 13 is formed also for the carbon nanotubes 11 positioned below the center of the shield plate 22.

As described above, the thickness of the covering layer 13 formed on the carbon nanotube 11 is controlled by the material gas supply amount. That is, the covering layer 13 of the carbon nanotube 11 which is not covered with the shield plate 22 is formed most thickly. In the part of the carbon nanotubes 11 covered with the shield plate 22, the covering layer 13 is formed so that its thickness decreases from the ends of the shield plate 22 toward the center. That is, the covering layer 13 is formed so that the thickness of the covering layer 13 is not uniform in the direction crossing the orientation direction of the carbon nanotubes 11.

As described with reference to FIG. 6, the concrete thickness of the covering layer 13 is set so that the bundle structure 12 including the plurality of carbon nanotubes 11 formed on the substrate 20 has predetermined Young's modulus with respect to the amount of deformation given in the thickness direction. The distribution in the plane direction of the thickness of the covering layer 13 is properly adjusted by changing the position, dimension, or shape of the shield plate 22 and film forming conditions such as the material gas supply amount.

Figure 13:
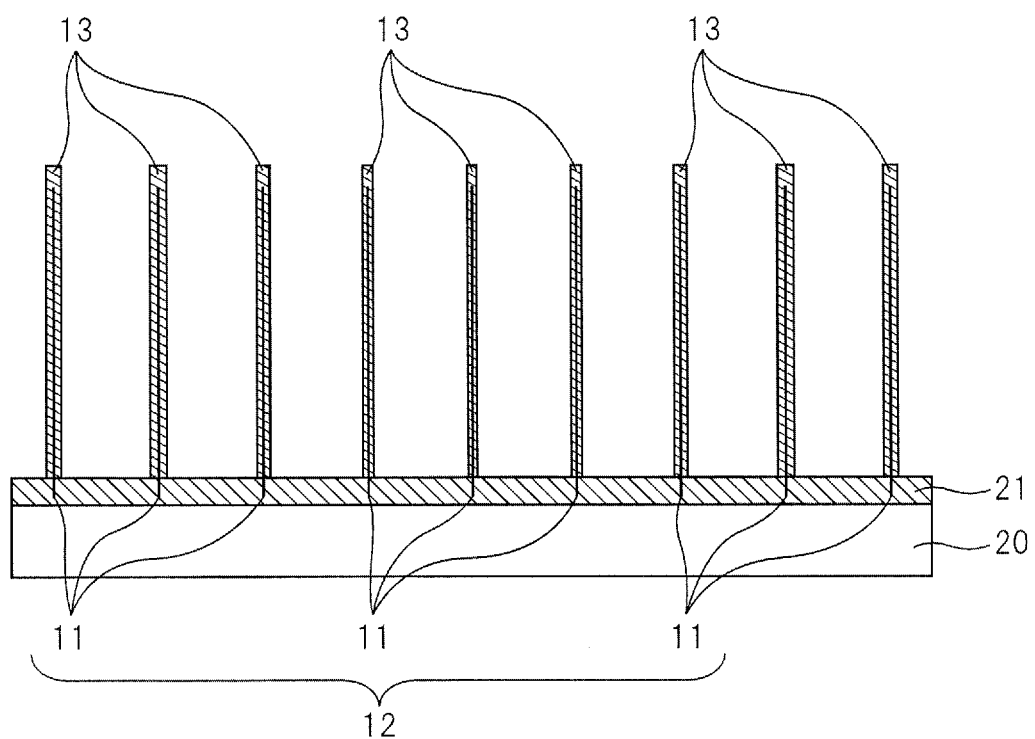
FIG. 13 is a diagram depicting a process (No. 6) of the first embodiment of the method of manufacturing the carbon nanotube sheet disclosed in the specification.

FIG. 13 depicts a state in which the covering layer 13 is formed in the entire surface of the substrate 20 on which the bundle structure 12 of the carbon nanotubes 11 is formed. Preferably, the covering layer 13 is formed so as to cover the plurality of carbon nanotubes 11 in the longitudinal direction. Preferably, the covering layer 13 is formed so as to cover the surface extending from one end to the other end in the longitudinal direction of the carbon nanotube 11. More preferably, the covering layer 13 is formed so as to continuously cover the entire surface extending from one end to the other end of the carbon nanotube 11.

The inventors of the present invention have found that, for formation of the covering layer 13 so as to cover the plurality of carbon nanotubes 11 in the longitudinal direction of the carbon nanotubes 11, although not limited, the ALD is suitable. The bundle structure 12 of the carbon nanotubes 11 has a form that an large number of carbon nanotubes 11 are densely provided in a small area. Consequently, the region generated in the gap between the plurality of carbon nanotubes 11 becomes a recessed part having an high aspect ratio. The inventors of the present invention have found that, to form the covering layer 13 so as to cover the plurality of carbon nanotubes 11 in the longitudinal direction of the covering layer 13, the film forming method realizing high coverage is desirable also in the recessed part having high aspect ratio. The inventors of the present invention paid attention to the fact that the ALD is the film forming method realizing high coverage also in the recessed part having high aspect ratio and found that the ALD is a preferred film forming method.

Although the end on the side opposite to the substrate 20 of the carbon nanotube 11 is covered with the covering layer 13, the end on the substrate 20 side is not covered. The invention, however, is not limited to this form.

Although the covering layer 13 can cover the neighboring carbon nanotubes 11 as a continuous film, the invention is not limited to the form. The neighboring carbon nanotubes 11 may be covered as independent two or more films with the covering layer 13.

With respect to the plurality of carbon nanotubes 11 entangled with one another as depicted in FIG. 4, the covering layer 13 can cover the neighboring carbon nanotubes 11 as a continuous film so as to connect the neighboring carbon nanotubes.

As the material of the covering layer 13, although not limited, for example, an oxidized metal such as aluminum oxide ($Al_2O_3$) or zinc oxide (ZnO) can be used. Alternatively, a metal such as copper (Cu), ruthenium (Ru), or platinum (Pt) can be used.

The covering layer 13 can be formed by using aluminum oxide. The film forming conditions in this case are that, for example, trimethylaluminum ($AL(CH_3)_3$) and water ($H_2O$) are used as material gas, and film forming temperature is 200° C.

The thermal conductivity of aluminum oxide is about 30 W/m·K. That is, the thermal conductivity of aluminum oxide is higher than the thermal conductivity (about 0.1 W/m·K) of thermoplastic resin but is lower than the thermal conductivity (about 47.1 W/m·K) per unit area of the bundle structure 12 of the carbon nanotubes 11.

The covering layer 13 can be formed by using zinc oxide. The film forming conditions are that, for example, diethyl zinc ($Zn(C_2H_5)_2$) and water ($H_2O$) are used as material gas, and film forming temperature is 200° C.

The thermal conductivity of zinc oxide is about 54 W/m·K. That is, the thermal conductivity of zinc oxide is higher than the thermal conductivity (about 47.1 W/m·K) per unit area of the bundle structure 12 of the carbon nanotubes 11.

The covering layer 13 can be formed by using copper. The film forming conditions in this case are that, for example, bis(N—N-diisopropylacetoamidinato) copper (I) and hydrogen ($H_2$) are used as material gas, and film forming temperature is 190° C.

The thermal conductivity of copper is about 390 W/m·K. That is, the thermal conductivity of copper is higher than the thermal conductivity (about 47.1 W/m·K) per unit area of the bundle structure 12 of the carbon nanotubes 11.

Further, as the material of the covering layer 13, any material can be employed as long as a film can be formed by using the material by the ALD. Main materials from which a film can be formed by the ALD include, for example, titanium oxide, hafnium oxide, iron oxide, indium oxide, lanthanum oxide, molybdenum oxide, niobium oxide, nickel oxide, ruthenium oxide, silicon oxide, vanadium oxide, tungsten oxide, yttrium oxide, zirconium oxide, manganese, iron, cobalt, nickel, copper, silver, lanthanum, and the like.

Figure 14:
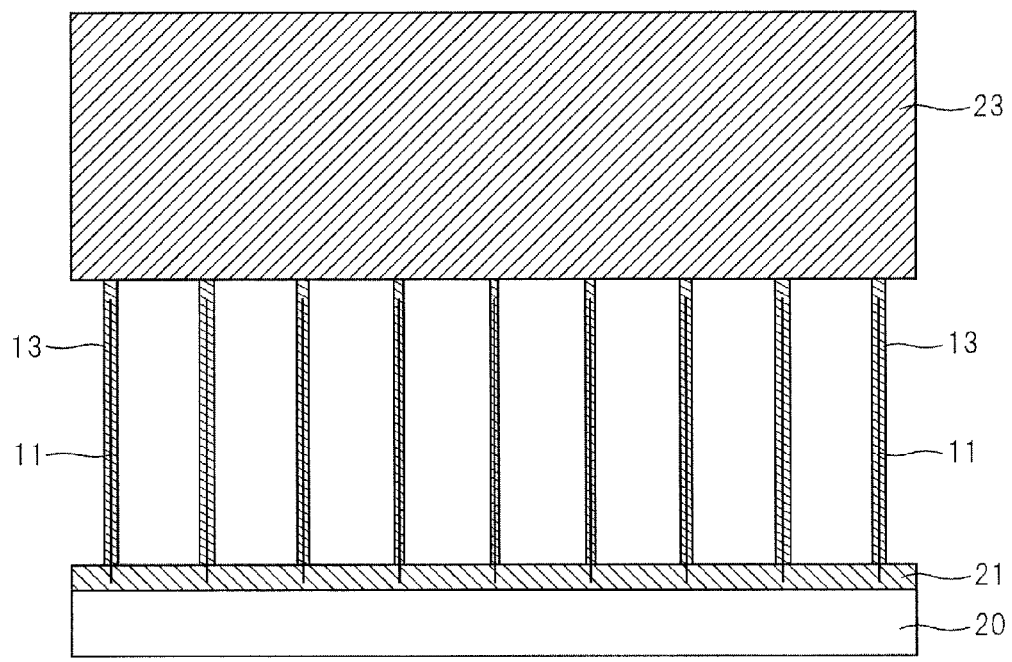
FIG. 14 is a diagram depicting a process (No. 7) of the first embodiment of the method of manufacturing the carbon nanotube sheet disclosed in the specification.

As depicted in FIG. 14, on the carbon nanotubes 11 on which the covering layer 13 is formed, a thermoplastic resin formed in a film state (thermoplastic resin film 23) is formed. Preferably, the thickness of the thermoplastic resin film 23 is properly set according to the length of the carbon nanotube 11. For example, in the case of forming the carbon nanotube sheet 10 depicted in FIG. 3, about 5 μm to 500 μm which is almost the same as the length of the carbon nanotube 11 is preferable. For example, in the case of forming the carbon nanotube sheet 10 depicted in FIG. 5, about 4 μm to 400 μm which is slightly smaller than the length of the carbon nanotube 11 is preferable.

An example of the thermoplastic resin of the thermoplastic resin film 23 is a hot-melt resin. Examples of the hot-melt resin include a polyamide hot-melt resin, a polyester hot-melt resin, polyurethane hot-melt resin, a polyolefin hot-melt resin, ethylene copolymer hot-melt resin, SBR hot-melt resin, EVA hot-melt resin, and butyl rubber hot-melt resin.

Figure 15:
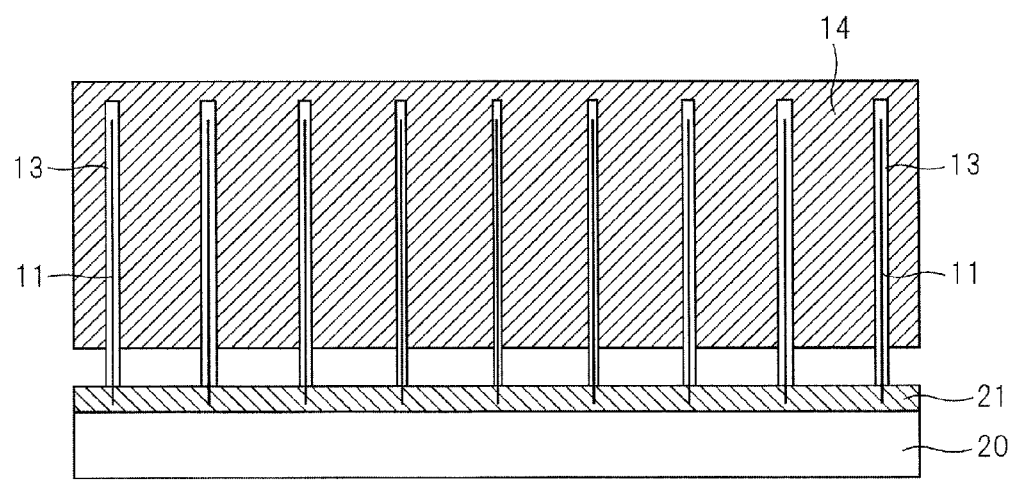
FIG. 15 is a diagram depicting a process (No. 8) of the first embodiment of the method of manufacturing the carbon nanotube sheet disclosed in the specification.

Next, the substrate 20 on which the thermoplastic resin film 23 is mounted is heated, for example, at a temperature of 195° C. The thermoplastic resin of the thermoplastic resin film 23 is melted and gradually penetrates in the gaps of the carbon nanotubes 11 on which the covering layer 13 is formed. In such a manner, as depicted in FIG. 15, the thermoplastic resin film 23 is allowed to penetrate so as to not reach the surface of the substrate 20.

By preliminarily processing the thermoplastic resin in a sheet state, the amount of the filling layer can be controlled by the thickness of the sheet film. Thus, by controlling heating temperature and heating time, the filling layer can be controlled so as not to reach the substrate 20.

The penetration of the thermoplastic resin film 23 is stopped before it reaches the substrate 20 to facilitate peeling of the carbon nanotube sheet 10 from the substrate 20. In the case such that the carbon nanotube sheet 10 can be easily peeled off from the substrate 20, penetration of the thermoplastic resin film 23 may reach the substrate 20.

The thickness of the thermoplastic resin film 23 penetrating in the gaps in the carbon nanotubes 11 on which the covering layer 13 is formed can be controlled by heat treatment time. For example, for the carbon nanotube 11 having a length of 100 μm grown by the above-described conditions, by performing heat treatment at 195° C. for one minute, the thermoplastic resin film 23 can be allowed to penetrate even to the degree that the film 23 does not reach the substrate 20.

Preferably, the heating time of the thermoplastic resin film 23 is properly set so that the thermoplastic resin film 23 penetrates to the degree that it does not reach the surface of the substrate 20 in accordance with the length of the carbon nanotube 11, viscosity when the thermoplastic resin melts, thickness of the thermoplastic resin film 23, and the like.

Although it is preferable to preliminarily process the thermoplastic resin into a film shape, the shape of the thermoplastic resin may be a pellet or rod shape.

Next, the thermoplastic resin film 23 is allowed to penetrate to a predetermined position, cooled to room temperature, and solidified. As a result, as depicted in FIG. 15, the filling layer 14 filling the gaps among the carbon nanotubes 11 on which the covering layer 13 is formed is obtained.

Subsequently, the carbon nanotubes 11 on which the covering layer 13 is formed and the filling layer 14 are peeled off from the substrate 20. When the filling layer 14 (the thermoplastic resin film 23) is formed so as not to reach the substrate 20 as described above, joint between the carbon nanotubes 11 on which the covering layer 13 and the substrate 20 is weak, so that the carbon nanotubes 11 on which the covering layer 13 is formed can be easily peeled off from the substrate 20.

At the time of peeling off the carbon nanotubes 11 on which the covering layer 13 is formed from the substrate 20, the covering layer 13 (not depicted) formed on the surface of the catalyst layer 21 between the neighboring carbon nanotubes 11 is not peeled off from the catalyst layer 21 but remains on the surface of the catalyst layer 21.

As described above, as depicted in FIG. 3, the carbon nanotube sheet 10 in which the filling layer 14 is provided in the gap between the plurality of carbon nanotubes 11 on which the covering layer 13 is formed is obtained.

Hereinafter, a preferred second embodiment of the method of manufacturing the carbon nanotube sheet 10 will be described with reference to FIGS. 16 to 19.

The manufacturing method of the embodiment has the same processes as those of the first embodiment until the process depicted in FIG. 10. In the second embodiment, however, the dimension of the substrate 20 is larger than that in the first embodiment.

Figure 16:
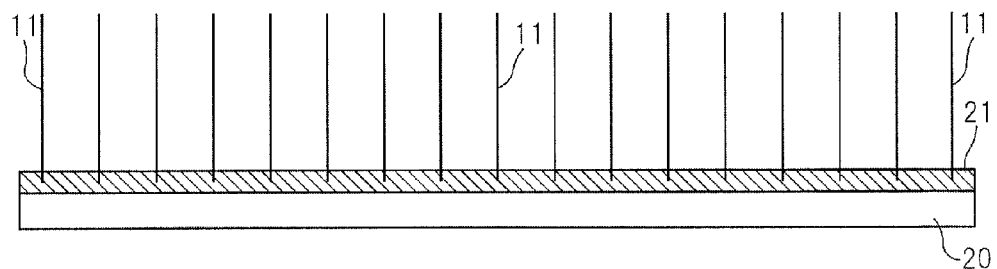
FIG. 16 is a diagram depicting a process (No. 1) of a second embodiment of a method of manufacturing a carbon nanotube sheet disclosed in the specification.

FIG. 16 depicts a state where the plurality of carbon nanotubes 11 oriented in the normal direction of the substrate 20 (vertical orientation) are formed on the substrate 20.

Figure 17:
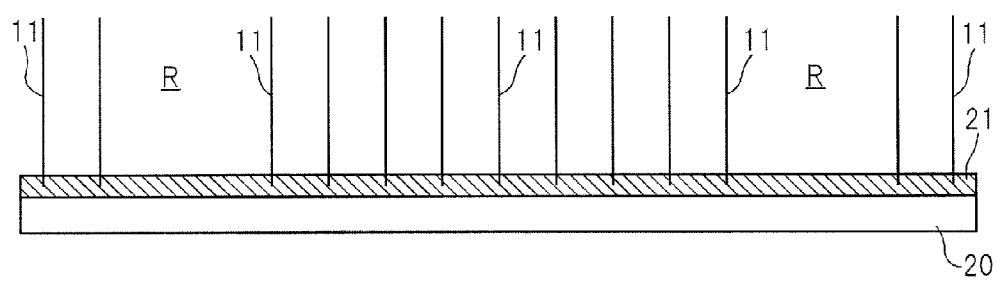
FIG. 17 is a diagram depicting a process (No. 2) of the second embodiment of the method of manufacturing the carbon nanotube sheet disclosed in the specification.

Next, as depicted in FIG. 17, a part of the plurality of carbon nanotubes 11 is removed from the substrate 20, and a region R in which the carbon nanotubes 11 are not formed is obtained. The portion on the inside of the region R will become a carbon nanotube sheet. Therefore, the shape of the region R in plan view draws the contour of the carbon nanotube sheet. As a method of removing the carbon nanotubes 11 from the substrate 20, for example, a jig having a tip on which an adhesive is applied is pressed on the substrate 20 to adhere the carbon nanotube 11 by the adhesive, and the carbon nanotube 11 is removed.

Figure 18:
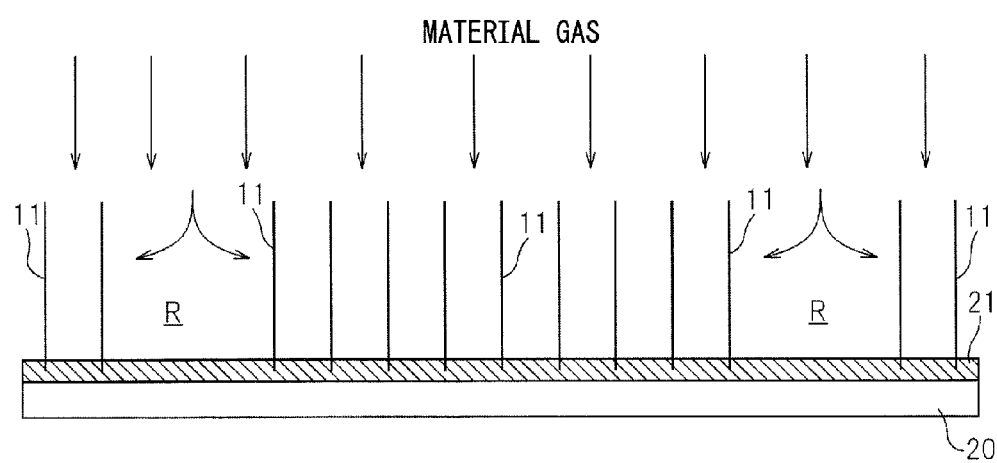
FIG. 18 is a diagram depicting a process (No. 3) of the second embodiment of the method of manufacturing the carbon nanotube sheet disclosed in the specification.

Subsequently, as depicted in FIG. 18, the covering layer 13 is formed above the carbon nanotubes 11 by using the atomic layer deposition (ALD). The material gas forming the covering layer 13 is passed from above the substrate 20 toward the substrate 20.

Therefore, the material gas is supplied from above the substrate 20 to each of the carbon nanotubes 11. The material gas flowed to the region R goes to the catalyst layer 21 without forming the covering layer above the carbon nanotubes 11, is blocked by the catalyst layer 21, and diffused to the plane direction of the substrate 20. Consequently, to the carbon nanotubes 11 positioned around the region R, the material gas is supplied from the sides. The amount of the material gas diffused from the region R to the plane direction of the substrate 20 decreases with distance from the carbon nanotube 11 positioned near the region R.

In such a manner, the thickness of the covering layer 13 formed on the carbon nanotube 11 is controlled by the supply amount of the material gas. That is, the covering layer 13 formed on the carbon nanotube 11 positioned near the region R is the thickest. With the distance from the region R, the thickness of the covering layer 13 formed decreases. The covering layer 13 on the carbon nanotube 11 positioned in the center between the two regions R is formed most thinly. That is, the covering layer 13 is formed so that its thickness is not uniform in the direction crossing the orientation direction of the carbon nanotubes 11.

The distribution in the plane direction of the thickness of the covering layer 13 is properly adjusted by changing the film forming conditions such as the dimension or shape of the region R and the supply amount and the like of the material gas.

Figure 19:
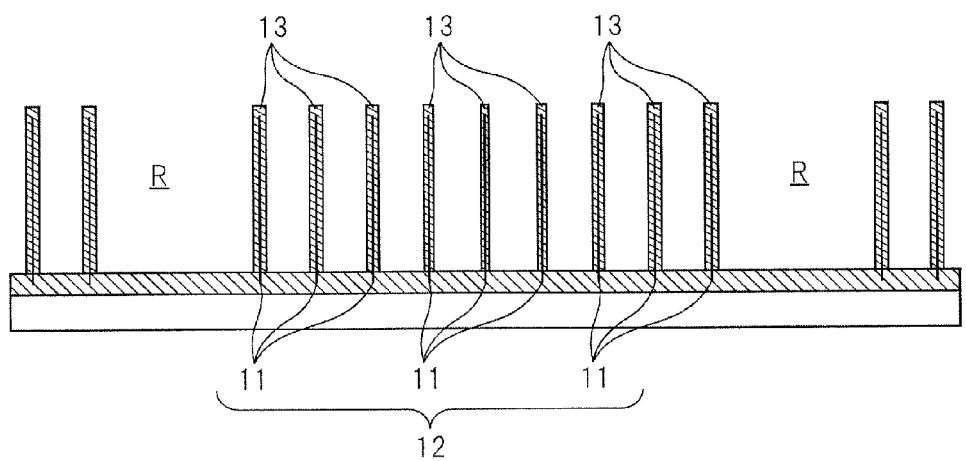
FIG. 19 is a diagram depicting a process (No. 4) of the second embodiment of the method of manufacturing the carbon nanotube sheet disclosed in the specification.

FIG. 19 depicts a state that the covering layer 13 is formed on the entire surface of the substrate 20 on which the bundle structure 12 of the carbon nanotubes 11 is formed. The following manufacturing processes are similar to those in the foregoing first embodiment. The carbon nanotube sheet 10 is obtained by cutting the portion on the inside of the region R.

Hereinafter, a preferred third embodiment of the method of manufacturing the carbon nanotube sheet 10 will be described with reference to FIGS. 20 and 21.

In the manufacturing method of the embodiment, the pattern of the catalyst layer formed in the process of FIG. 9 is different from that of the first embodiment. In the third embodiment, the dimension of the substrate 20 is larger than that of the first embodiment.

Figure 20:
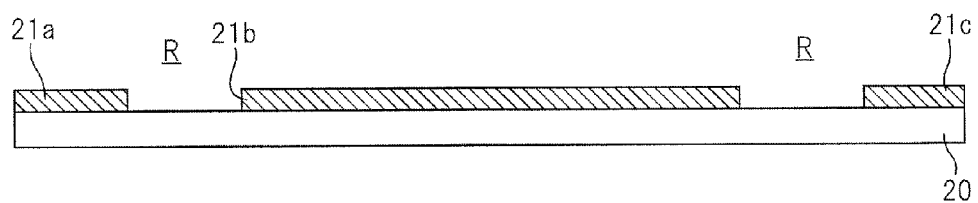
FIG. 20 is a diagram depicting a process (No. 1) of a third embodiment of a method of manufacturing a carbon nanotube sheet disclosed in the specification.

In the embodiment, as depicted in FIG. 20, catalyst layers 21a, 21b, and 21c are formed on the substrate 20 so as to provide regions R in which no carbon nanotubes 11 are formed. Since there is no catalyst layer in the part of the region R, the carbon nanotubes 11 are not formed on the substrate 20. The catalyst layers 21a, 21b, and 21c are selectively formed on predetermined regions of the substrate 20 by using, for example, the lift-off method.

Figure 21:
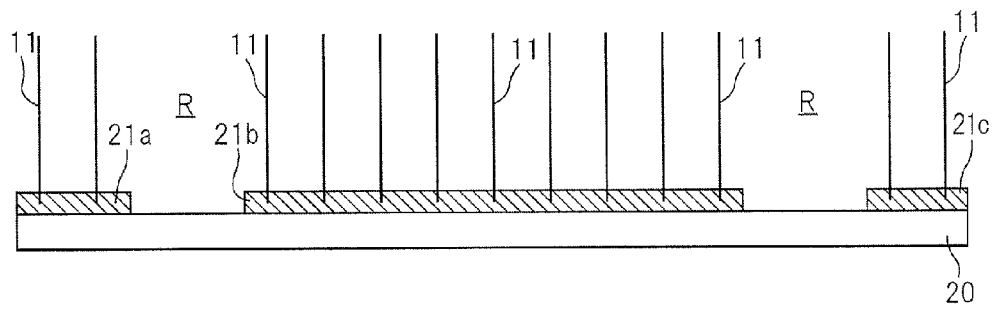
FIG. 21 is a diagram depicting a process (No. 2) of the third embodiment of the method of manufacturing the carbon nanotube sheet disclosed in the specification.

Next, as depicted in FIG. 21, the carbon nanotubes 11 are grown using the catalyst layers 21a, 21b, and 21c as catalysts by, for example, hot-filament CVD. On the substrate 20, a plurality of carbon nanotubes 11 oriented in the normal direction of the substrate 20 (vertical orientation) are formed in the parts in which the carbon layers 21a, 21b, and 21c are provided. On the other hand, no carbon nanotube 11 is formed in the regions R.

The following manufacturing processes are similar to those in the foregoing second embodiment.

Hereinafter, an embodiment of a method of manufacturing the electronic device 30 will be described with reference to FIGS. 22 to 24.

Figure 22:
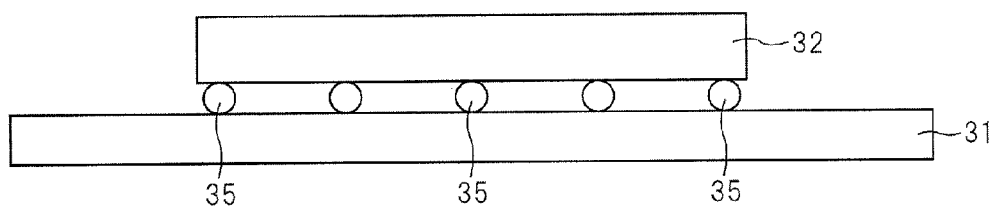
FIG. 22 is a diagram depicting a process (No. 1) of an embodiment of a method of manufacturing an electronic device disclosed in the specification.

First, as depicted in FIG. 22, the semiconductor device 32 is mounted over the circuit board 31 made of a synthetic resin via the solders 35.

Figure 23:
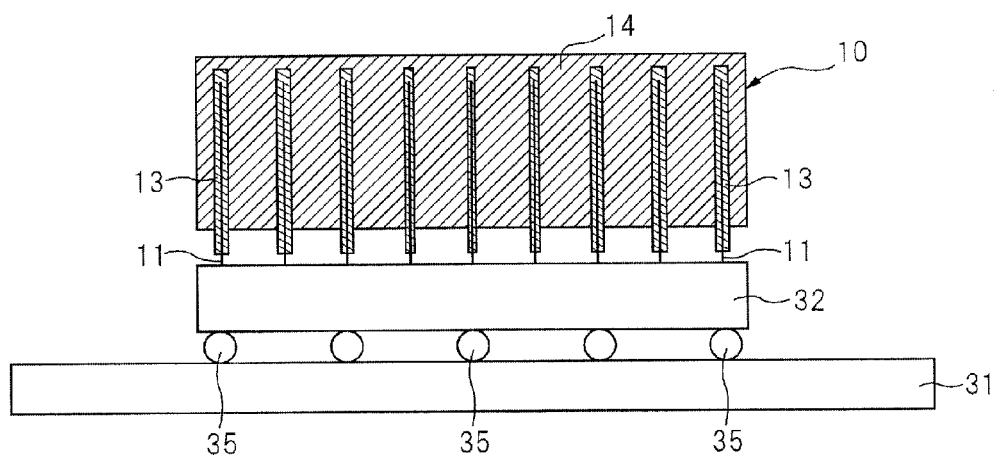
FIG. 23 is a diagram depicting a process (No. 2) of the embodiment of the method of manufacturing the electronic device disclosed in the specification.

Next, as depicted in FIG. 23, the carbon nanotube sheet 10 is mounted over the semiconductor device 32. The carbon nanotube sheet 10 is a thermal conduction sheet used as a thermal interface material. FIG. 23 depicts the case of using the carbon nanotube sheet depicted in FIG. 3, but the invention is not limited to the case. For example, the carbon nanotube sheet depicted in FIG. 5 may be used.

Figure 24:
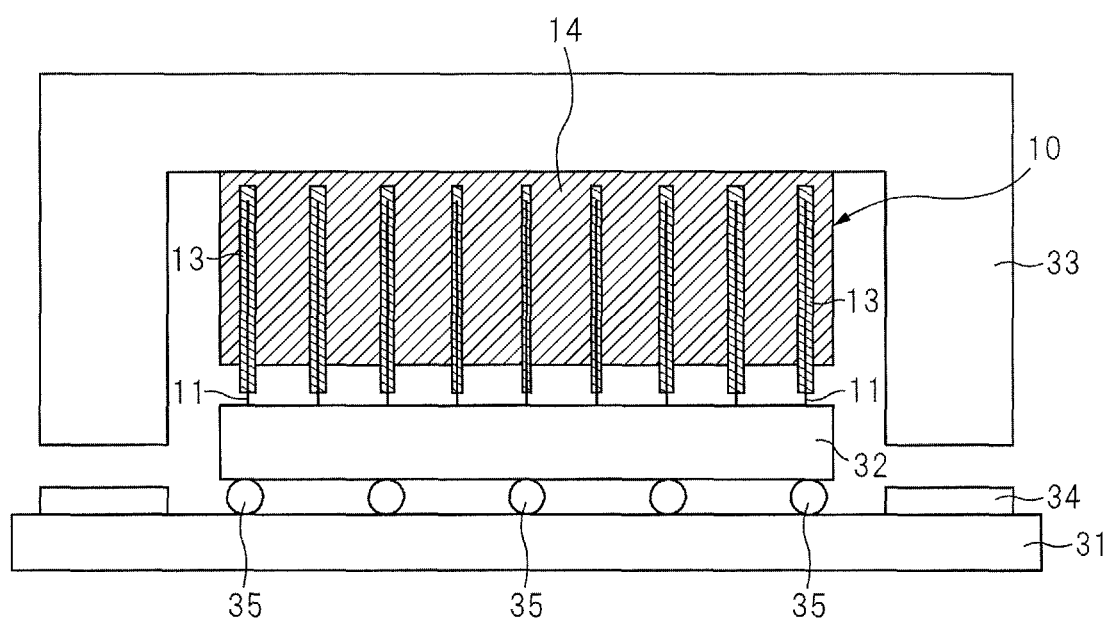
FIG. 24 is a diagram depicting a process (No. 3) of the embodiment of the method of manufacturing the electronic device disclosed in the specification.

As depicted in FIG. 24, an organic sealant for forming a joining part to fix the heat spreader 33 is applied on the circuit board 31 and, after that, the heat spreader 33 is put on the semiconductor device 32 on which the carbon nanotube sheet 10 is mounted.

Subsequently, heat treatment is performed in a state where a predetermined load is applied to the heat spreader 33 to reflow the carbon nanotube sheet 10. In the carbon nanotube sheet 10, in a state where a load of, for example, 0.25 MPa is applied, heat treatment of, for example, 195° C. for ten minutes is performed.

By the heat treatment, the thermoplastic resin forming the filling layer 14 in the carbon nanotube sheet 10 is melted to a liquid state, and the carbon nanotube sheet 10 is deformed so as to be fit along the uneven shape of the surface of the semiconductor device 32 and the heat spreader 33. In the carbon nanotubes 11 in the carbon nanotube sheet 10, restraint by the filling layer 14 is loosened, and the ends of the carbon nanotubes 11 are coupled to the semiconductor device 32 and the heat spreader 33 without the filling layer 14.

By providing the covering layer 13, the mechanical strength of the carbon nanotubes 11 can be increased. It can increase the mechanical strength of the bundle structure 12 of the carbon nanotubes 11, and the load tolerance of the carbon nanotube sheet 10 can be improved. Consequently, in the reflow process, even in the case where an excessive load is applied to the heat spreader 33, it can be suppressed that the bundle structure 12 of the carbon nanotubes 11 in the carbon nanotube sheet 10 is pressed and deformed to a thin film state.

With the configuration, even in the case where an excessive load is applied to the heat spreader 33 in the reflow process, the plurality of carbon nanotubes 11 included in the bundle structure 12 can be loosened so as to fit the uneven shape of the surface of the semiconductor device 32 and the heat spreader 33. Therefore, the number of carbon nanotubes coupled to the semiconductor device 32 and the heat spreader 33 without the filling layer 14 can be increased, and a thermal conduction path formed by the carbon nanotubes 11 between the semiconductor device 32 and the heat spreader 33 can be made thick. As a result, in the carbon nanotube sheet 10, the thermal resistance between the semiconductor device 32 and the heat spreader 33 can be suppressed to be low.

The load in the reflow process may be in a load range in which the carbon nanotubes 11 on which the covering layer 13 is formed are slackened so as to be fit to the uneven shapes existing in the surface of the semiconductor device 32 and the heat spreader 33 and, therefore, obtain a sufficient contact state with the semiconductor device 32 and the heat spreader 33.

It is sufficient to select the temperature and time of the heat treatment so that the thermoplastic resin interposing between the semiconductor device 32 and the heat spreader 33 melts and shifts and the ends of the carbon nanotubes 11 are coupled to the semiconductor device 32 and the heat spreader 33 without the filling layer 14.

The circuit board 31 and the like are cooled down to the room temperature to solidify the thermoplastic resin in the filling layer 14, and fix the heat spreader 33 to the circuit board 31 by the joining part 34 to thereby obtain the electronic device 30 depicted in FIG. 2. The thermoplastic resin expresses adhesiveness, and the semiconductor device 32 and the heat spreader 33 can be adhered and fixed by the carbon nanotube sheet 10.

Although the circuit board 31 and the semiconductor device 32 are thermally expanded by the heating in the reflow process, the thermal expansion coefficient of the circuit board 31 formed by the synthetic resin is larger than that of the semiconductor device 32.

Consequently, in the cooled electronic device 30, due to the difference in the thermal expansion coefficient between the circuit board 31 and the semiconductor device 32, the semiconductor device 32 is deformed in a shape curved upward toward the heat spreader 33. The part of the circuit board 31 joined to the semiconductor device 32 via the solders 35 is also similarly deformed to the shape curved upward.

As described above, as the semiconductor device 32 is deformed, the distance between the semiconductor device 32 and the heat spreader 33 becomes non-constant. The carbon nanotube sheet 10 disposed between the semiconductor device 32 and the heat spreader 33 is compressed in the thickness direction. Since the semiconductor device 32 is deformed so as to be curved upward, the center part in the carbon nanotube sheet 10 is largely deformed so as to be compressed more than the peripheral part. Consequently, the thickness of the center part of the carbon nanotube sheet 10, which is constant in the beginning, becomes smaller than in the peripheral part.

In the carbon nanotube sheet 10, the thickness of the covering layer 13 in the part where the distance between the heat spreader 33 and the semiconductor device 32 is long is larger than that of the covering layer 13 in the part where the distance between the heat spreader 33 and the semiconductor device 32 is short. The elastic modulus in the thickness direction of the carbon nanotube sheet 10 is adjusted by the thickness of the covering layer 13, and is set so that the stress in the thickness direction in the plane of the deformed carbon nanotube sheet 10 becomes constant.

Accordingly, the stress in the thickness direction in the plane of the deformed carbon nanotube sheet 10 becomes almost constant. Therefore, the contact pressure between the carbon nanotube 11 and the semiconductor device 32 or the heat spreader 33 in the center part and that in the peripheral part in the deformed carbon nanotube sheet 10 are almost the same. Consequently, thermal resistance between the carbon nanotube 11 and the semiconductor device 32 or the heat spreader 33 becomes almost constant in the plane direction of the deformed carbon nanotube sheet 10, so that the thermal conduction becomes constant.

Therefore, the electronic device 30 having the carbon nanotube sheet 10 whose thermal conduction in the plane is constant has excellent heat dissipation property.

In the specification, the expression that the stress in the thickness direction in the plane of the carbon nanotube sheet 10 is constant refers to the state where the stress ratio as a ratio between stress in a part where the deformation amount in the thickness direction is maximum and stress in a part where the deformation amount is minimum is in the range of 0.5 to 1.0. When the stress ratio is 0.5 or higher, the contact pressure between the carbon nanotube 11 and the semiconductor device 32 or the heat spreader 33 becomes uniform, and it assures that the thermal conduction in the plane direction is constant. From this viewpoint, the stress ratio is more preferably 0.7 or higher. More preferably, the stress ratio is 0.8 or higher.

Also after cooling to the room temperature, by the deformed carbon nanotube sheet 10, low thermal resistance between the semiconductor device 32 and the heat spreader 33 can be maintained. Thus, the carbon nanotube sheet 10 functions as a thermal interface material between the semiconductor device 32 and the heat spreader 33.

In the present invention, the sheet structure, the method of manufacturing the sheet structure, the electronic device, and the method of manufacturing the electronic device of the foregoing embodiments can be properly changed without departing from the gist of the invention. The components of any of the embodiments can be properly applied to another embodiment.

For example, although the semiconductor device is curved toward the heat spreader in the electronic device of the foregoing embodiment, the semiconductor device may be curved toward the circuit board. In the case where the thermal expansion coefficient of the circuit board is smaller than that of the semiconductor device, the semiconductor device may be deformed as described above. When the semiconductor device is deformed so as to be curved toward the circuit board, the peripheral part in the carbon nanotube sheet is largely deformed so as to be compressed in the thickness direction more than that in the center part.

In this case, by setting the thickness of the covering layer in the center part of the carbon nanotube sheet to be larger than that in the peripheral part, the stress in the sheet plane can be made uniform.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it is to be understood that the various changes, substitutions, and alterations are possible without departing from the spirit and scope of the invention.

What is claimed is:

1. A sheet structure comprising:
    a bundle structure including a plurality of linear structures made of carbon which are oriented in a predetermined direction;
    a covering layer covering each of the plurality of linear structures made of carbon; and
    a filling layer provided between the plurality of linear structures made of carbon covered with the covering layer,
    wherein thickness of the covering layer is not uniform in a direction crossing the predetermined direction and
    thickness of the sheet structure is not constant, and
    the thickness in the direction crossing the predetermined direction of the covering layer in a part where the sheet structure is thicker is larger than that of the covering layer in a part where the sheet structure is thinner.

2. The sheet structure according to claim 1, wherein elasticity is provided in reaction to deformation given in the predetermined direction.

3. The sheet structure according to claim 1, wherein thermal conductivity of the covering layer is higher than thermal conductivity per unit area of the bundle structure.

4. The sheet structure according to claim 1, wherein surface density of the linear structures made of carbon in the bundle structure is $1 \times 10^{10}$ or larger.

5. An electronic device comprising:
    a heat generating member;
    a heat dissipating member; and
    a sheet structure including
        a bundle structure including a plurality of linear structures made of carbon which are oriented in a predetermined direction;
        a covering layer covering each of the plurality of linear structures made of carbon; and
        a filling layer provided between the plurality of linear structures made of carbon covered with the covering layer,
        wherein thicknesses of the covering layers are not uniform in a direction crossing the predetermined direction, and the sheet structure is disposed between the heat generating member and the heat dissipating member and
    distance between the heat generating member and the heat dissipating member is not constant, and
    the thickness in the direction crossing the predetermined direction of the covering layer in a part where distance between the heat dissipating member and the heat generating member is longer is larger than that of the covering layer in a part where the distance between the heat generating member and the heat dissipating member is shorter.

* * * * *